(12) United States Patent
Noguchi et al.

(10) Patent No.: US 12,066,580 B2
(45) Date of Patent: Aug. 20, 2024

(54) PHOTODETECTION DEVICE

(71) Applicant: KYOCERA Corporation, Kyoto (JP)

(72) Inventors: Noboru Noguchi, Kizugawa (JP); Yasuhiro Yanagihara, Kyoto (JP); Nobuyuki Shima, Otsu (JP)

(73) Assignee: Kyocera Corporation, Kyoto (JP)

( * ) Notice: Subject to any disclaimer, the term of this patent is extended or adjusted under 35 U.S.C. 154(b) by 159 days.

(21) Appl. No.: 17/802,930

(22) PCT Filed: Feb. 1, 2021

(86) PCT No.: PCT/JP2021/003532
§ 371 (c)(1),
(2) Date: Aug. 26, 2022

(87) PCT Pub. No.: WO2021/171914
PCT Pub. Date: Sep. 2, 2021

(65) Prior Publication Data
US 2023/0086700 A1 Mar. 23, 2023

(30) Foreign Application Priority Data
Feb. 28, 2020 (JP) ................................. 2020-033272

(51) Int. Cl.
*G01T 1/20* (2006.01)
*H01L 27/146* (2006.01)
*H01L 31/0392* (2006.01)

(52) U.S. Cl.
CPC ...... *G01T 1/2018* (2013.01); *H01L 27/14605* (2013.01); *H01L 27/14663* (2013.01); *H01L 31/03926* (2013.01)

(58) Field of Classification Search
None
See application file for complete search history.

(56) References Cited

U.S. PATENT DOCUMENTS

| | | | |
|---|---|---|---|
| 5,869,834 A * | 2/1999 | Wipenmyr | ........ H01L 31/02027 257/E31.116 |
| 2014/0339561 A1 * | 11/2014 | Yokoyama | ............ H01L 31/115 257/53 |
| 2023/0268359 A1 * | 8/2023 | Chavez | ............. H01L 31/02161 250/206 |

FOREIGN PATENT DOCUMENTS

| | | |
|---|---|---|
| JP | 2016-92077 A | 5/2016 |
| KR | 2019-0075423 A | 7/2019 |

* cited by examiner

*Primary Examiner* — Edwin C Gunberg
(74) *Attorney, Agent, or Firm* — Procopio, Cory, Hargreaves & Savitch LLP (57) ABSTRACT

A photodetection device includes a substrate and a plurality of pixel units. The plurality of pixel units includes a pixel unit including a first photodetector in an active area, and a pixel unit including a second photodetector in an inactive area. The first photodetector includes a first lower electrode layer, a first lower extrinsic semiconductor layer, a first intrinsic semiconductor layer, a first upper extrinsic semiconductor layer, and a first upper electrode layer. The second photodetector includes a second lower electrode layer, a second lower extrinsic semiconductor layer, a second intrinsic semiconductor layer, a second upper extrinsic semiconductor layer, and a second upper electrode layer. The second lower electrode layer is covered with the second lower extrinsic semiconductor layer and the second intrinsic semiconductor layer.

16 Claims, 7 Drawing Sheets

PHOTODETECTION DEVICE

TECHNICAL FIELD

The present disclosure relates to a photodetection device that is used to obtain, for example, an image of a subject through photoelectric conversion.

BACKGROUND OF INVENTION

A known technique is described in, for example, Patent Literature 1.

CITATION LIST

Patent Literature

Patent Literature 1: Japanese Unexamined Patent Application Publication No. 2016-92077

SUMMARY

In an aspect of the present disclosure, a photodetection device includes a substrate, a plurality of pixel units on the substrate, a first photodetector included in a pixel unit of the plurality of pixel units, and a second photodetector included in a pixel unit of the plurality of pixel units. The plurality of pixel units is in a matrix of a row direction and a column direction. The pixel unit including the first photodetector is in an active area usable for photodetection on the substrate. The pixel unit including the second photodetector is in an inactive area unusable for photodetection. The inactive area surrounds the active area on the substrate. The first photodetector includes a first lower electrode layer on the substrate, a first lower extrinsic semiconductor layer containing a first extrinsic semiconductor and located on the first lower electrode layer and inside the first lower electrode layer in a plan view, a first intrinsic semiconductor layer on the first lower extrinsic semiconductor layer, a first upper extrinsic semiconductor layer containing a second extrinsic semiconductor and located on the first intrinsic semiconductor layer, and a first upper electrode layer on the first upper extrinsic semiconductor layer. The second photodetector includes a second lower electrode layer on the substrate, a second lower extrinsic semiconductor layer containing the first extrinsic semiconductor and located on the second lower electrode layer and covering the second lower electrode layer, a second intrinsic semiconductor layer on the second lower extrinsic semiconductor layer, a second upper extrinsic semiconductor layer containing the second extrinsic semiconductor and located on the second intrinsic semiconductor layer, and a second upper electrode layer on the second upper extrinsic semiconductor layer.

BRIEF DESCRIPTION OF THE DRAWINGS

The objects, features, and advantages of the present disclosure will become more apparent from the following detailed description and the drawings.

DESCRIPTION OF EMBODIMENTS

A photodetection device according to the present disclosure will now be described with reference to the drawings.

A photodetection device with the structure that forms the basis of the photodetection device according to the present disclosure includes multiple pixel units each including a thin film transistor arranged on a substrate to serve as a switching element, a photoelectric converter stacked on the thin film transistor with an insulating layer in between to serve as a photodetector, and a contact hole that connects the photoelectric converter and an electrode in the thin film transistor to allow conduction between them. The photoelectric converter includes a first electrode layer, a first extrinsic semiconductor layer, an intrinsic semiconductor layer, a second extrinsic semiconductor layer, and a second electrode layer that are stacked on one another from a position nearer the thin film transistor. The multiple pixel units are in a matrix of a row direction and a column direction.

In the photodetection device with the structure that forms the basis of the photodetection device according to the present disclosure, the first electrode layer, the first extrinsic semiconductor layer, the intrinsic semiconductor layer, the second extrinsic semiconductor layer, and the second electrode layer are stacked on the insulating layer to form the photoelectric converter. The first electrode layer, the first extrinsic semiconductor layer, the intrinsic semiconductor layer, the second extrinsic semiconductor layer, and the second electrode layer are formed by depositing the material for each layer through, for example, sputtering or plasma CVD (chemical vapor deposition), performing photolithography (exposure with light), and then patterning or removing a remaining photoresist through dry etching. At this time, the mask decomposition reaction in the plasma atmosphere of an etching gas has a higher rate in a central area in a chamber, and has a lower rate in a peripheral area adjacent to the chamber walls of the chamber.

In a dry etching process, a substrate placed in the chamber has, around a central area in the chamber, an active area containing pixel units used for photodetection, and has, around a peripheral area in the chamber, an inactive area containing dummy pixel units unused for photodetection. Thus, the pixel units in the inactive area are etched at a low etching rate, or etched slowly, in a dry etching process of the intrinsic semiconductor layer in a manufacturing process. After etching of the intrinsic semiconductor layer and the first extrinsic semiconductor layer in the pixel unit in the active area that is etched at a high etching rate, the first electrode layer in the active area is etched intensively. Thus, the inactive area is etched at a lower etching rate, and the first extrinsic semiconductor layer and the intrinsic semiconductor layer in the pixel unit located in the inactive area are more likely to remain unetched. The manufacturing yield can decrease easily.

Figure 1:
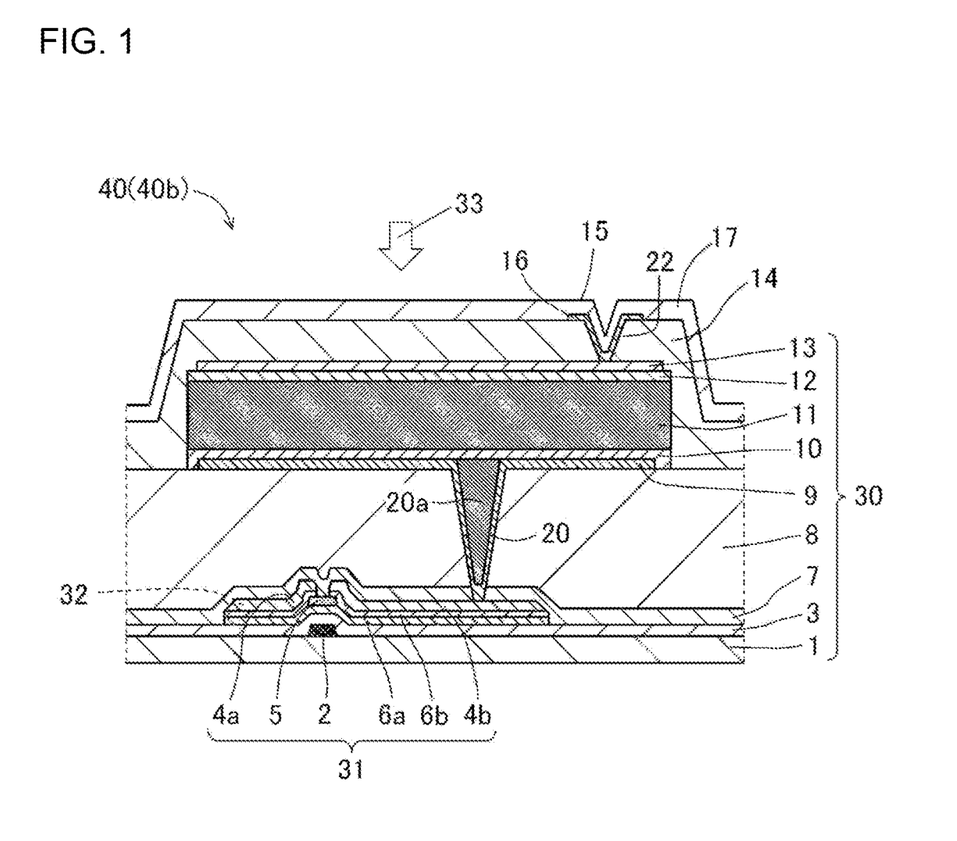
FIG. 1 is a cross-sectional view of a pixel unit included in a photodetection device according to an embodiment of the present disclosure.
Figure 2:
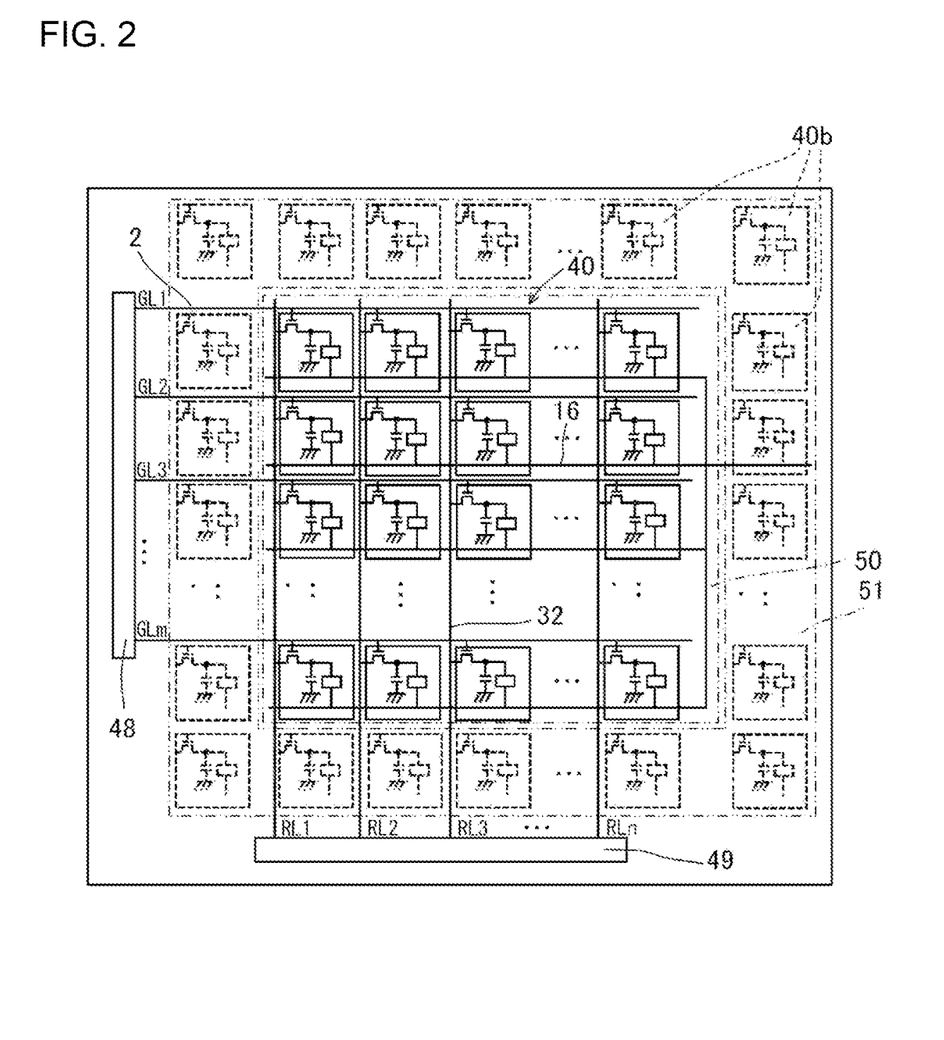
FIG. 2 is a block diagram of the photodetection device.
Figure 3:
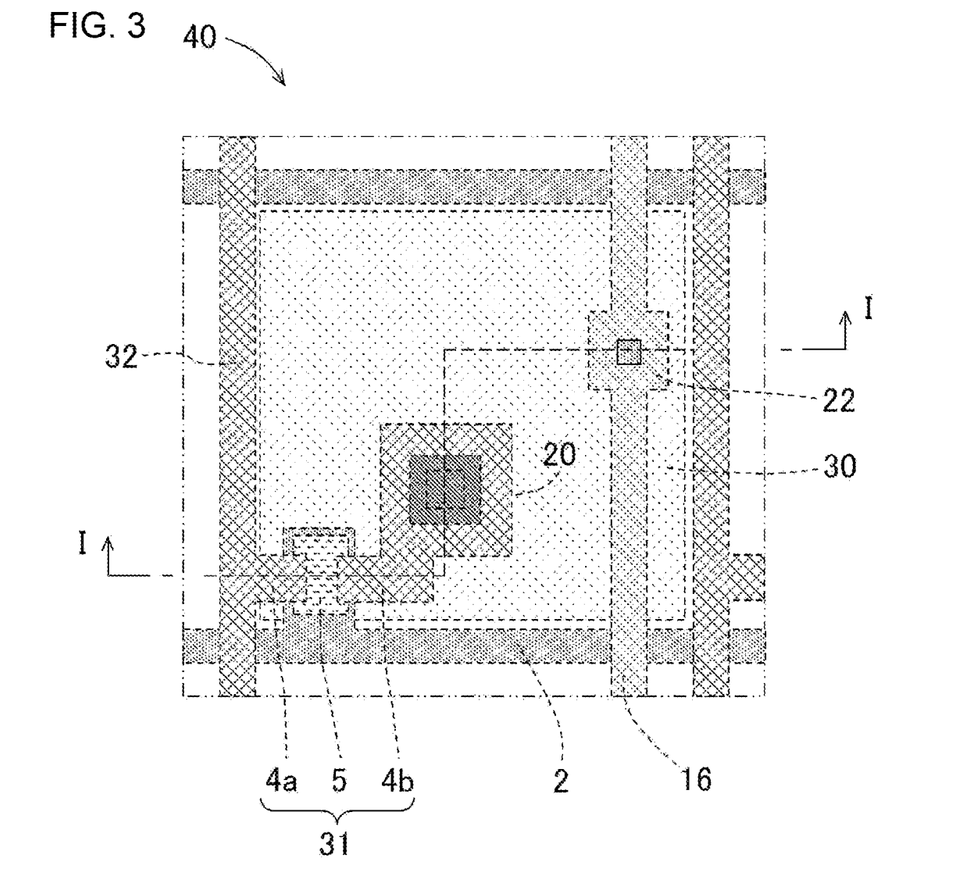
FIG. 3 is a plan view of the pixel unit.

FIG. 1 is a cross-sectional view of a pixel unit included in a photodetection device according to an embodiment of the present disclosure. FIG. 2 is a block diagram of the photodetection device. FIG. 3 is a plan view of the pixel unit. FIG. 1 is a cross-sectional view taken along line I-I in FIG. 3. The photodetection device according to the present embodiment includes a substrate 1 including, for example, a glass substrate, and multiple pixel units 40 on the substrate 1 in a matrix of the row and column directions. The multiple pixel units 40 each include a photodetector 30 that performs photoelectric conversion of incident light and outputs a received signal, and a TFT (thin film transistor) 31 or a switching element that obtains, as an electric signal, an electric charge obtained through photoelectric conversion performed by the photodetector 30. The photodetector 30 functions as a photoelectric converter that converts light into an electric charge, forming a PIN photodiode. The PIN photodiode includes an intrinsic semiconductor layer (or I-type semiconductor layer) at a PN junction. The PIN photodiode differs from a PN photodiode and includes the intrinsic semiconductor layer. The PIN photodiode thus includes a depletion layer that increases its size in response to a reverse voltage being applied. This structure achieves high-speed response. In addition, the PIN photodiode outperforms the PN photodiode in dark current occurring in response to a reverse voltage being applied.

The substrate 1 may be made of a glass material, a resin material such as an acrylic resin, polycarbonate, or polyethylene terephthalate, or a ceramic material such as alumina ceramics. The substrate 1 may be a composite substrate including a stack of multiple types of substrates each made of one of a glass material, a resin material, or a ceramic material. The substrate 1 may be a flexible substrate made of a flexible material such as a resin material described above. In this case, the substrate 1 is lightweight, and is installable along, for example, a curve of a human body. The substrate 1 also has higher impact resistance, and can thus be less susceptible to breakage upon being dropped or colliding against, for example, another component or device during, for example, transportation.

The photodetector 30 is mounted on an insulating layer 8 stacked on the TFT 31 on the substrate 1, and connected to a drain electrode 4b in the TFT 31 through a lower contact hole 20 to allow conduction between them. The photodetector 30 includes a lower electrode layer 9, a lower extrinsic semiconductor layer 10, an intrinsic semiconductor layer 11, an upper extrinsic semiconductor layer 12, and an upper electrode layer 13 that are stacked on one another from a position nearer the substrate 1. The lower contact hole 20 may include part of the lower electrode layer 9 on an inner peripheral surface of a recess that is formed by removing a predetermined portion of the insulating layer 8 through, for example, etching, and an insulating filler 20a filled in a space defined by the lower electrode layer 9.

The extrinsic semiconductor is a pure intrinsic semiconductor to which a small amount of dopant of about $10^{16}$ to $10^{17}$ cm$^{-3}$ is added (or doped). The doping element determines whether the extrinsic semiconductor is classified into a p-type semiconductor including holes serving as carriers or an n-type semiconductor including electrons serving as carriers. The semiconductor is a p-type or n-type semiconductor depending on the valence of the dopant element and the valence of the semiconductor substituted by the dopant. For example, silicon (Si) with the valence of 4 doped with, for example, phosphorus (P) or arsenic (As) with the valence of 5 forms an n-type semiconductor, and Si with the valence of 4 doped with, for example, boron (B) or aluminum (Al) with the valence of 3 forms a p-type semiconductor.

The insulating filler 20a forming the lower contact hole 20 illustrated in FIG. 1 may contain an organic material. Examples of the organic material include an acrylic resin, a silicone resin, a polyimide, a polyamide, a polyimide-amide, a benzocyclobutene, a polysiloxane, and a polysilazane. A polysiloxane has a backbone structure with coupled silicon (Si) and oxygen (O). A substituent for the above material may be an organic group including at least hydrogen, for example, an alkyl group or an aromatic hydrocarbon group, or may be a fluoro group, or an organic group including at least hydrogen and a fluoro group. A polysilazane includes, as a parent material, a polymer in which silicon (Si) and nitrogen (N) are coupled.

Example materials of the insulating filler 20a include a photosensitive organic resin that cures with light such as ultraviolet rays and a thermosetting resin. When a photosensitive organic resin is used, an uncured organic resin paste is applied in the lower contact hole 20 to fill the lower contact hole 20 with the organic resin paste, and then the organic resin paste is irradiated with light such as ultraviolet rays. The organic resin paste may be further heated to be cured.

As illustrated in FIG. 3, the pixel unit 40 is rectangular in a plan view, and includes, at one corner, an upper contact hole 22 to apply a bias voltage to the photodetector 30. The pixel unit 40 includes, on its light receiving surface, a bias line 16, which provides a bias voltage to the photodetector 30, along a source signal line 32. The pixel unit 40 also includes the TFT 31 at its corner diagonal to the above one corner in a plan view. As illustrated in FIG. 1, the TFT 31 includes a first semiconductor layer 6a serving as a channel, an etching stop layer 5 of, for example, silicon nitride (SiNx), a second semiconductor layer 6b, a source electrode 4a, and the drain electrode 4b. The second semiconductor layer 6b electrically connects the first semiconductor layer 6a to the source electrode 4a and the drain electrode 4b. The lower contact hole 20 is formed around the center portion of the pixel unit 40 to guide the electric charge obtained through photoelectric conversion performed by the photodetector 30 to the drain electrode 4b in the TFT 31. The source signal line 32 outputs the electric charge obtained through photoelectric conversion performed by the photodetector 30 as an electric signal corresponding to the amount of electric charge.

The TFT 31 may be a TFT with a back-channel cut structure instead of a TFT with a channel stopper structure including the etching stop layer 5. The semiconductor contained in the TFT 31 may be an oxide semiconductor such as LTPS (low-temperature polysilicon) or IGZO (indium gallium zinc oxide).

The substrate 1 may be, for example, a glass substrate. A gate line 2 that controls the on and off states of the TFT 31 is located on one surface (pixel-unit receiving surface) of the substrate 1, and a gate insulating layer 3 covers the surface of the substrate 1 and the gate line 2. The first semiconductor layer 6a serving as a channel is located on a portion on the gate insulating layer 3 that covers the gate line 2. The first semiconductor layer 6a is made of, for example, amorphous silicon (a-Si). The etching stop layer 5 is located on a portion of the first semiconductor layer 6a overlapping the gate line 2. The second semiconductor layer 6b of, for example, n+-type a-Si covers the etching stop layer 5 and the first semiconductor layer 6a. The source electrode 4a and the drain electrode 4b of a metal such as tantalum (Ta), neodymium (Nd), tungsten (W), titanium (Ti), molybdenum (Mo), aluminum (Al), chromium (Cr), or silver (Ag) or an alloy of these are located on the second semiconductor layer 6b to form the TFT 31.

The second semiconductor layer 6b includes portions electrically insulated from each other. The portions receive the corresponding source electrode 4a and drain electrode 4b, which are electrically insulated from each other. A first passivation layer 7 of, for example, silicon oxide (SiO$_2$) or silicon nitride (SiNx) covers the TFT 31 and the gate insulating layer 3. The insulating layer 8 of, for example, an acrylic resin covers the first passivation layer 7.

The lower electrode layer 9 of a metal such as Ta, Nd, W, Ti, Mo, Al, Cr, or Ag or an alloy of any of these metals, the lower extrinsic semiconductor layer 10 of, for example, n+-type a-Si, the intrinsic semiconductor layer 11 of intrinsic Si (I-type Si), the upper extrinsic semiconductor layer 12 of, for example, p+-type a-Si, and the upper electrode layer 13 including a transparent electrode of, for example, an ITO (indium tin oxide) are stacked on the insulating layer 8. The lower electrode layer 9, the lower extrinsic semiconductor layer 10, the intrinsic semiconductor layer 11, the upper extrinsic semiconductor layer 12, and the upper electrode layer 13 form a PIN photodiode serving as the photodetector 30. This PIN photodiode performs photoelectric conversion of light 33 incident on the intrinsic semiconductor layer 11 from a position nearer the upper extrinsic semiconductor layer 12 and the upper electrode layer 13.

The photodetectors 30 include a first photodetector 30a and a second photodetector 30b. The first photodetector 30a is included in a pixel unit 40 of the multiple pixel units 40 located in an active area 50 used for photodetection on the substrate 1. The second photodetector 30b is included in a pixel unit 40b of the multiple pixel units 40 located in an inactive area 51 unused for photodetection. The inactive area surrounds the active area 50 on the substrate 1. For ease of explanation, the subscript a is added to reference numerals of components located in the active area 50, the subscript b is added to reference numerals of components located in the inactive area 51, and the subscripts a and b are not used for the components in general. The pixel unit 40b in the inactive area 51 has the same structure as a pixel unit 40a in the active area 50, and is thus not described.

Figure 4A:
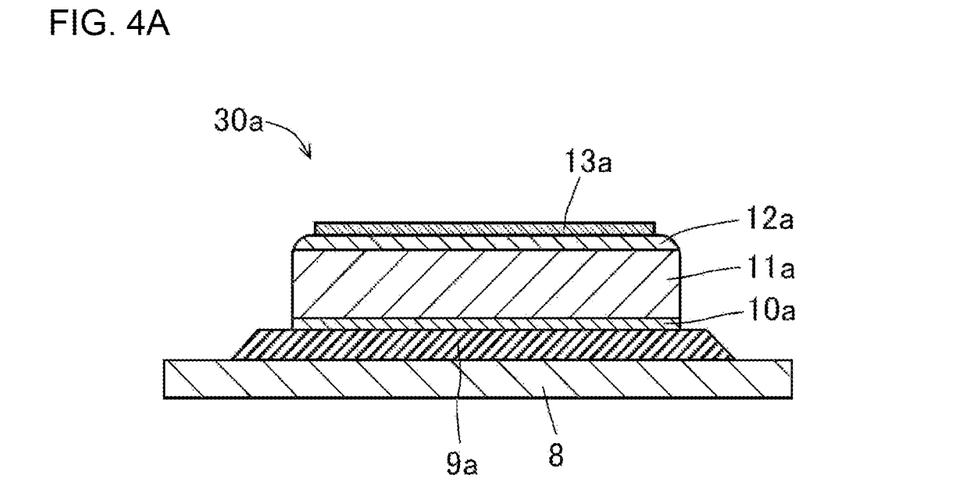
FIG. 4A is a simplified cross-sectional view of a first photodetector located in an active area.

FIG. 4A is a simplified cross-sectional view of the first photodetector 30a located in the active area 50. FIG. 4B is a simplified cross-sectional view of the second photodetector 30b located in the inactive area 51. The first photodetector 30a includes, on the insulating layer 8 on the substrate 1, a first lower electrode layer 9a of a metal or an alloy, a first lower extrinsic semiconductor layer 10a of a first extrinsic semiconductor located on and inside the first lower electrode layer 9a in a plan view, a first intrinsic semiconductor layer 11a located on the first lower extrinsic semiconductor layer 10a, a first upper extrinsic semiconductor layer 12a located on the first intrinsic semiconductor layer 11a and made of a second extrinsic semiconductor, and a first upper electrode layer 13a located on the first upper extrinsic semiconductor layer 12a.

Figure 4B:
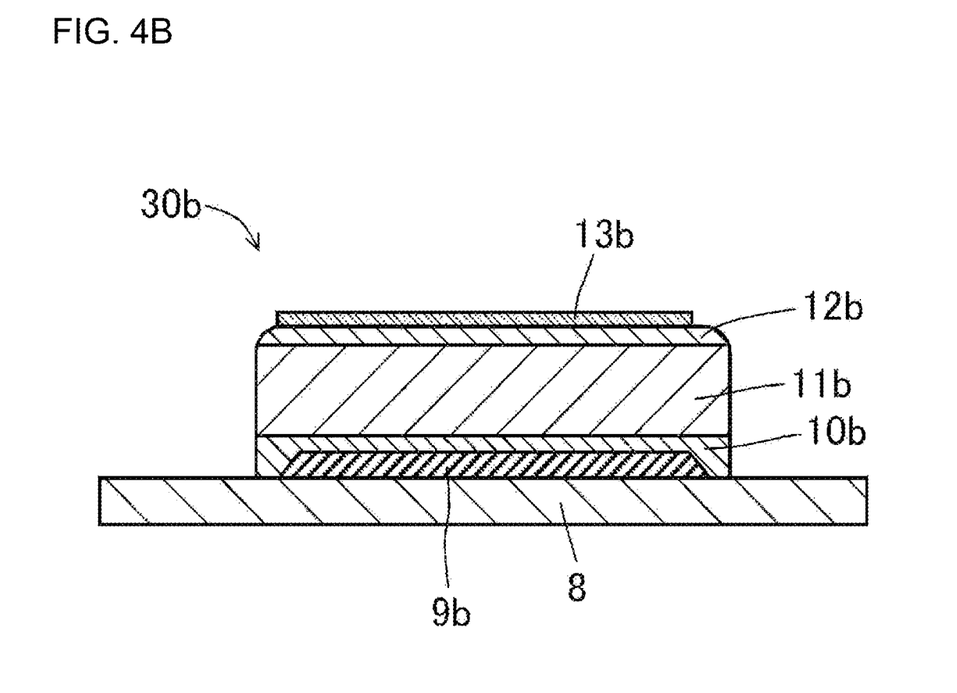
FIG. 4B is a simplified cross-sectional view of a second photodetector located in an inactive area.

The second photodetector 30b includes, on the insulating layer 8 on the substrate 1, a second lower electrode layer 9b of a metal or an alloy, a second lower extrinsic semiconductor layer 10b of a first extrinsic semiconductor located on the second lower electrode layer 9b and covering the second lower electrode layer 9b, a second intrinsic semiconductor layer 11b located on the second lower extrinsic semiconductor layer 10b, a second upper extrinsic semiconductor layer 12b of a second extrinsic semiconductor located on the second intrinsic semiconductor layer 11b, and a second upper electrode layer 13b located on the second upper extrinsic semiconductor layer 12b.

Figure 5A:
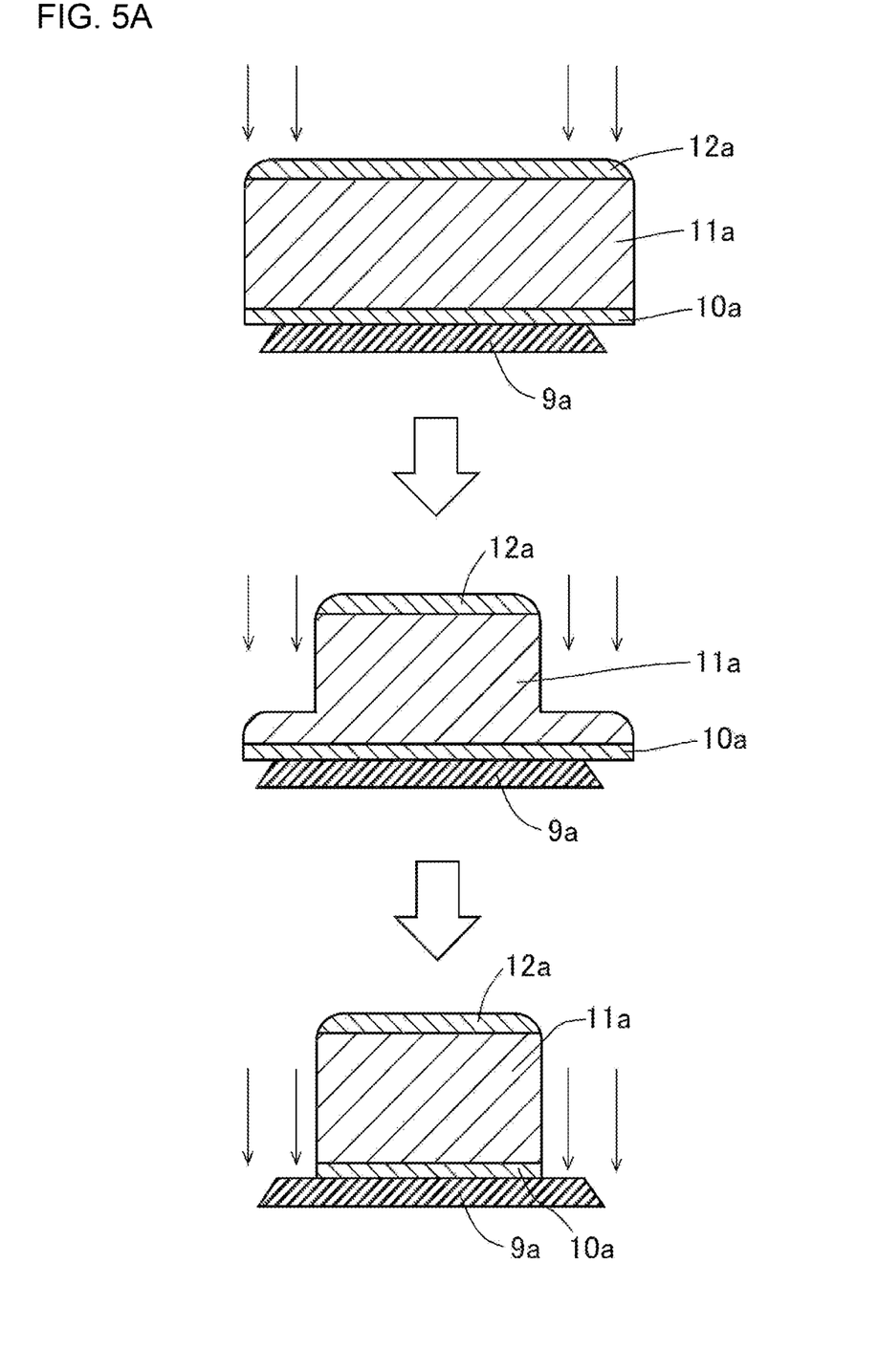
FIG. 5A is a diagram describing a process of forming a first lower extrinsic semiconductor layer, a first intrinsic semiconductor layer, and a first upper extrinsic semiconductor layer in a first photodetector.
Figure 5B:
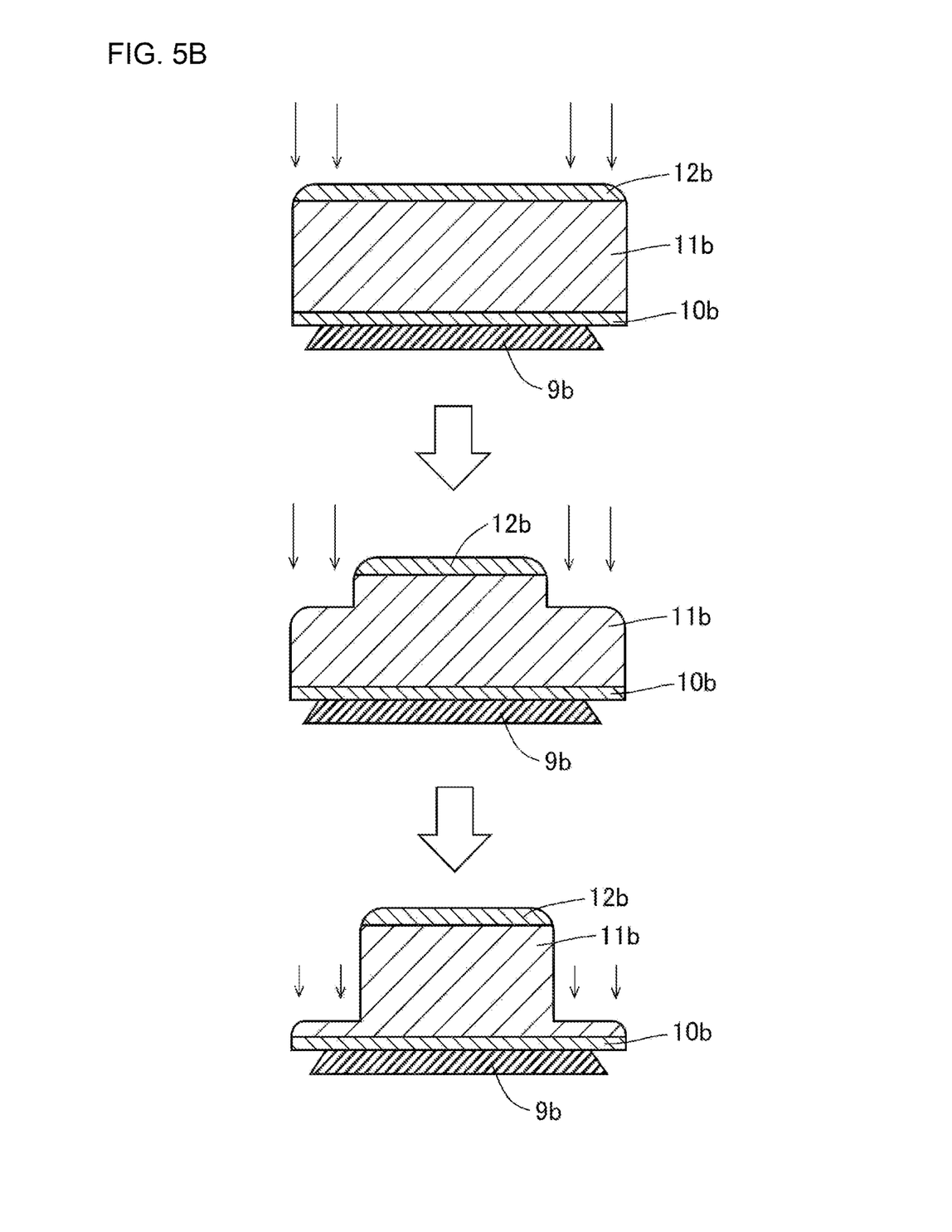
FIG. 5B is a diagram describing a process of forming a second lower extrinsic semiconductor layer, a second intrinsic semiconductor layer, and a second upper extrinsic semiconductor layer in a second photodetector with the structure that forms the basis of the present disclosure.

FIG. 5A is a schematic diagram describing a process of forming the first lower extrinsic semiconductor layer 10a, the first intrinsic semiconductor layer 11a, and the first upper extrinsic semiconductor layer 12a in the first photodetector 30a. FIG. 5B is a schematic diagram describing a process of forming the second lower extrinsic semiconductor layer 10b, the second intrinsic semiconductor layer 11b, and the second upper extrinsic semiconductor layer 12b in the second photodetector 30b with the structure that forms the basis of the present disclosure. In the process of fabricating the first photodetector 30a and the second photodetector 30b, the first lower electrode layer 9a and the second lower electrode layer 9b are formed by, for example, sputtering, and the first lower extrinsic semiconductor layer 10a and the second lower extrinsic semiconductor layer 10b are formed by a thin film formation method such as CVD. The first lower electrode layer 9a and the second lower electrode layer 9b have a thickness of about 30 to 500 nm, the first lower extrinsic semiconductor layer 10a and the second lower extrinsic semiconductor layer 10b have a thickness of about 30 to 200 nm, the first intrinsic semiconductor layer 11a and the second intrinsic semiconductor layer 11b have a thickness of about 500 to 2000 nm, the first upper extrinsic semiconductor layer 12a and the second upper extrinsic semiconductor layer 12b have a thickness of about 5 to 50 nm, and the first upper electrode layer 13a and the second upper electrode layer 13b have a thickness of about 30 to 100 nm.

The first photodetector 30a and the second photodetector 30b are fabricated in the manner described below. The first lower electrode layer 9a and the second lower electrode layer 9b are stacked on the insulating layer 8, and then etched by dry etching to have intended patterns. The first lower electrode layer 9a and the second lower electrode layer 9b are made of the same material, and thus are stacked at the same time.

Subsequently, the first lower extrinsic semiconductor layer 10a, the first intrinsic semiconductor layer 11a, and the first upper extrinsic semiconductor layer 12a are sequentially stacked on the insulating layer 8 and the first lower electrode layer 9a, and the second lower extrinsic semiconductor layer 10b, the second intrinsic semiconductor layer 11b, and the second upper extrinsic semiconductor layer 12b are sequentially stacked on the second lower electrode layer 9b. The first lower extrinsic semiconductor layer 10a, the first intrinsic semiconductor layer 11a, and the first upper extrinsic semiconductor layer 12a are then etched by dry etching to have an intended pattern, and the second lower extrinsic semiconductor layer 10b, the second intrinsic semiconductor layer 11b, and the second upper extrinsic semiconductor layer 12b are etched by dry etching to have an intended pattern. The first lower extrinsic semiconductor layer 10a and the second lower extrinsic semiconductor layer 10b are made of the same material, and thus are stacked at the same time. The first intrinsic semiconductor layer 11a and the second intrinsic semiconductor layer 11b are also stacked at the same time. The first upper extrinsic semiconductor layer 12a and the second upper extrinsic semiconductor layer 12b are also stacked at the same time.

Subsequently, the first upper electrode layer 13a is stacked on the insulating layer 8 and on the stack (first stack) including the first lower electrode layer 9a, the first lower extrinsic semiconductor layer 10a, the first intrinsic semiconductor layer 11a, and the first upper extrinsic semiconductor layer 12a. The second upper electrode layer 13b is then stacked on the stack (second stack) including the second lower electrode layer 9b, the second lower extrinsic semiconductor layer 10b, the second intrinsic semiconductor layer 11b, and the second upper extrinsic semiconductor layer 12b. The first upper electrode layer 13a and the second upper electrode layer 13b are made of the same material, and thus are stacked at the same time. Finally, the first upper electrode layer 13a and the second upper electrode layer 13b are etched by dry etching to have an intended pattern. Thus, as illustrated in FIG. 5A, the first lower electrode layer 9a has its outer periphery protruding and being exposed outside. In contrast, the second lower electrode layer 9b has its outer periphery unexposed under the second lower extrinsic semiconductor layer 10b. More specifically, as illustrated in FIG. 4B, the second lower electrode layer 9b is covered with the second lower extrinsic semiconductor layer 10b.

In some embodiments, the first photodetector 30a and the second photodetector 30b are fabricated in the manner described below. First, the first lower electrode layer 9a and the second lower electrode layer 9b, the first lower extrinsic semiconductor layer 10a and the second lower extrinsic semiconductor layer 10b, the first intrinsic semiconductor layer 11a and the second intrinsic semiconductor layer 11b, the first upper extrinsic semiconductor layer 12a and the second upper extrinsic semiconductor layer 12b, and the first upper electrode layer 13a and the second upper electrode layer 13b are stacked on the insulating layer 8. The first lower extrinsic semiconductor layer 10a and the second lower extrinsic semiconductor layer 10b, the first intrinsic semiconductor layer 11a and the second intrinsic semiconductor layer 11b, the first upper extrinsic semiconductor layer 12a and the second upper extrinsic semiconductor layer 12b, and the first upper electrode layer 13a and the second upper electrode layer 13b then have their outer peripheries removed by dry etching. As illustrated in FIG. 5A, the first lower electrode layer 9a has its outer periphery protruding and being exposed outside. In contrast, the second lower electrode layer 9b has its outer periphery embedded in the second lower extrinsic semiconductor layer 10b. More specifically, as illustrated in FIG. 4B, the second lower electrode layer 9b is covered with the second lower extrinsic semiconductor layer 10b.

As illustrated in FIG. 5B, in the photodetection device with the structure that forms the basis of the present disclosure, the second lower extrinsic semiconductor layer 10b and the second intrinsic semiconductor layer 11b remain partially unetched. This is because the dry etching process of the second intrinsic semiconductor layer 11b included in the pixel unit 40 located in the inactive area 51 is performed at a lower etching rate, and after the first intrinsic semiconductor layer 11a and the first lower extrinsic semiconductor layer 10a in the pixel unit 40 in the active area 50 that are etched at a higher etching rate are etched, the first lower electrode layer 9a in the active area is etched intensively, and thus, the pixel unit 40 in the inactive area is etched at a lower etching rate. In the photodetection device according to the present embodiment, the second lower electrode layer 9b is covered with the second lower extrinsic semiconductor layer 10b, and thus is not etched intensively. Thus, the portion of the pixel unit 40 located in the inactive area 51 nearer the active area 50 is not etched intensively, and a portion of the pixel unit 40 located in the inactive area 51 farther from the active area 50 can avoid being etched insufficiently. More specifically, all the pixel units in the inactive area are etched uniformly. Thus, the second lower extrinsic semiconductor layer and the second intrinsic semiconductor layer can avoid remaining partially unetched, and the yield in the process of manufacturing the photodetection device is less likely to decrease.

Dry etching, which is a type of etching, is often used for etching a semiconductor material such as silicon (Si). An example of dry etching can be reactive ion etching involving ionizing a gas with plasma and producing radicals for etching.

Reactive ion etching is a technique of etching a process target using excited active species including ions and radicals in an ionized gas from plasma (discharge) caused in a chamber. In reactive ion etching, the frequencies of a radio-frequency electric field that causes plasma are 13.56 MHz and 2.54 GHz. Examples of a material gas (etching material gas) causing plasma include tetrafluorosilane ($SiF_4$), hexafluorosilane ($SiF_6$), carbon tetrafluoride ($CF_4$), sulfur hexafluoride ($SF_6$), and trifluoromethane ($CHF_3$). Etching a silicon material such as polysilicon or amorphous silicon may use a fluorine gas such as tetrafluorosilane ($SiF_4$).

Substances to be etched are basically classified into four types including oxides such as silicon dioxide ($SiO_2$) and tetraethyl orthosilicate tetraethoxysilane ($Si(OC_2H_5)_4$), nitrides such as silicon nitride (SiN), silicon-based substances such as silicon (Si), tungsten silicon (WSi), molybdenum silicon (MoSi), and titanium silicon (TiSi), and metal substances such as aluminum (Al), an aluminum alloy, titanium (Ti), titanium nitride (TiN), titanium tungsten (TiW), tungsten (W), copper (Cu), platinum (Pt), and gold (Au).

Radicals are chemical species including free atoms and free molecules that have an unpaired electron generated by ionization of a gas, and are extremely reactive, unstable active species. Atoms and molecules usually include pairs of two electrons (shared electron pairs) on the same orbital. However, for example, electron transfer caused by intense energy such as heat or light, or cleavage of a chemical bond causes an unpaired electron, which forms a radical. A radical does not have a shared electron pair, and is thus an extremely unstable, highly reactive molecule species. For example, when silicon dioxide ($SiO_2$) undergoes dry etching with carbon tetrafluoride ($CF_4$), a reaction occurs as written in the Reaction Formula 1 below.

$$SiO_2 + CF_3 + F^* \text{(fluoride ion radicals)} \rightarrow SiF_4 + CO_x \qquad (1)$$

While this reaction continues, silicon dioxide ($SiO_2$) continues being etched.

Radicals are localized on the lower electrode layer 9 in the active area 50 in a central area in the chamber during dry etching in the chamber seemingly for the reason described below. Ion radicals include two types, or cation radicals and anion radicals. A cation radical has one electron removed from the highest occupied molecular orbital. An anion radical is a chemical species having one electron added to the lowest unoccupied orbital.

A fluoride ion radical has one electron removed from the highest occupied atomic orbital, and thus tends to capture an electron from the process target to be chemically stable. In other words, for the process target of metal such as the lower electrode layer 9, a radical tends to capture a free electron of metal or to form a pair of electrons with the free electron to be chemically stable. Thus, fluoride ion radicals are localized on the electrode of metal. In other words, this may result from the electrode of metal functioning as a grounding conductor for the fluoride ion radicals.

In the photodetection device according to the present embodiment, during manufacture, the second lower electrode layer 9b in the pixel unit 40 located in the inactive area 51 is covered with the second lower extrinsic semiconductor layer 10b and the second intrinsic semiconductor layer 11b not to be directly exposed to the etching atmosphere gas as illustrated in FIG. 4B.

In the first photodetector 30a included in the pixel unit 40 in the active area 50, the first lower extrinsic semiconductor layer 10a is located on and inside the first lower electrode layer 9a in a plan view. In other words, the first lower electrode layer 9a has its outer periphery protruding from the first lower extrinsic semiconductor layer 10a and the first intrinsic semiconductor layer 11a and exposed. Thus, when the first lower electrode layer 9a is covered with the first lower extrinsic semiconductor layer 10a and the first intrinsic semiconductor layer 11a, portions of the first lower extrinsic semiconductor layer 10a and the first intrinsic semiconductor layer 11a near the end face of the first lower electrode layer 9a can avoid being broken, or for example, cracked by internal stress during manufacture of the photodetection device. Broken portions such as cracks result from an increase of the internal stress at the portions of the first lower extrinsic semiconductor layer 10a and the first intrinsic semiconductor layer 11a near the end face of the first lower electrode layer 9a. Broken portions such as cracks obstruct photoelectric conversion. The photodetection device with this structure can thus prevent a decrease in the efficiency of photoelectric conversion.

Although the second lower electrode layer 9b in the second photodetector 30b in the present embodiment is covered with the second lower extrinsic semiconductor layer 10b, the second photodetector 30b included in the pixel unit 40 located in the inactive area 51, which serves as a dummy photodetector, causes no issue when portions of the second lower extrinsic semiconductor layer 10b and the second intrinsic semiconductor layer 11b located near the end face of the second lower electrode layer 9b are broken or cracked during manufacture of the photodetection device.

In the photodetection device according to the present embodiment, the second intrinsic semiconductor layer 11b may cover the second lower extrinsic semiconductor layer 10b. In this case, the end of the second lower electrode layer 9b is covered with the second lower extrinsic semiconductor layer 10b and the second intrinsic semiconductor layer 11b. This structure can more effectively prevent the end of the second lower electrode layer 9b from being intensively etched. The end face of the second lower electrode layer 9b is covered with the second lower extrinsic semiconductor layer 10b and the second intrinsic semiconductor layer 11b. Thus, a large part of the line of electric force directed from the end face of the second lower electrode layer 9b passes through the second lower extrinsic semiconductor layer 10b and the second intrinsic semiconductor layer 11b. This structure can avoid a decrease in the efficiency of photoelectric conversion of the second photodetector 30b.

The end face of the first lower electrode layer 9a may be a gentle slope that forms, with the surface of the substrate 1 on which the pixel units 40 are arrayed, an angle ($\theta1$) that is an acute angle (angle less than 90°). In that case, the protrusion of the first lower electrode layer 9a protruding from the first lower extrinsic semiconductor layer 10a and exposed has a larger surface area. With this structure, the protrusion of the first lower electrode layer 9a is less likely to be etched and to have an excessively small size or to be removed when the protrusion of the first lower electrode layer 9a is etched intensively. The protrusion of the first lower electrode layer 9a remaining sufficiently after being etched enables application of a sufficiently large electric field between the first lower electrode layer 9a and the first upper electrode layer 13a. This structure can avoid a decrease in the efficiency of photoelectric conversion of the first photodetector 30a. The angle $\theta1$ may be less than or equal to about 80°, within a range of about 10 to 80°, or within a range of about 30 to 60°.

When the angle $\theta1$ exceeds 80°, the end face may decrease the effect of preventing the protrusion of the first lower electrode layer 9a from being etched and having an excessively small size or being removed. When the angle $\theta1$ is smaller than 10°, the protrusion of the first lower electrode layer 9a may be sparse.

The first lower electrode layer 9a may contain aluminum. Aluminum is a highly conductive light metal. When ionized, aluminum forms a trivalent positive ion, and has three unpaired electrons in the outermost shell electron orbital in atoms. More specifically, aluminum has a large number of free electrons resulting from, for example, temperature rise or the photoelectric effect resulting from, for example, electromagnetic wave radiation. Aluminum thus increases the effect of the fluoride ion radicals capturing free electrons on the surface of aluminum, or forming electron pairs with the free electrons for chemical stabilization. Thus, the fluoride ion radicals are more likely to be localized on the first lower electrode layer 9a containing aluminum in the structure in the present disclosure.

The first lower electrode layer 9a may be made of, for example, Al, Al/Ti, Ti/Al/Ti, Mo/Al/Mo, or MoNd/AlNd/MoNd. Al/Ti indicates a stacked structure including a Ti layer stacked on an Al layer. The first lower electrode layer 9a may be made of duralumin (an Al—Cu alloy, an Al—Cu—Mg alloy, or an Al—Zn—Mg—Cu alloy), or an aluminum alloy mainly containing aluminum.

The end face of the second lower electrode layer 9b may be a gentle slope that forms, with the surface of the substrate 1 on which the pixel units are arrayed, an angle ($\theta2$) that is an acute angle (angle less than 90°). In this case, portions of the second lower extrinsic semiconductor layer 10b and the second intrinsic semiconductor layer 11b near the end face of the second lower electrode layer 9b are less susceptible to breakage or cracking during manufacture of the photodetection device. The second photodetector 30b included in the pixel unit 40 located in the inactive area 51 is a dummy photodetector unused for photodetection, but may be used as an inspection photodetector. In other words, the pixel unit 40 located in the inactive area 51 may be an inspection pixel unit for indirectly inspecting the pixel unit 40 in the active area 50. In this case, the end face of the second lower electrode layer 9b may be a gentle slope forming the angle $\theta2$ that is an acute angle. The angle $\theta2$ may be less than or equal to about 80°, or less than or equal to about 60°.

To more effectively reduce broken portions such as cracks, the angle $\theta2$ may be less than or equal to 45°, within a range of about 3 to 30°, or within a range of about 5 to 20°. The angle $\theta2$ exceeding 45° is more likely to cause broken portions such as cracks as described above. The angle $\theta2$ smaller than 3° is more likely to cause the end of the second lower electrode layer 9b to be sparse.

The second lower electrode layer 9b may contain aluminum. Aluminum is a highly conductive light metal. When ionized, aluminum forms a trivalent positive ion, and has three unpaired electrons in the outermost shell electron orbital in atoms. More specifically, aluminum has a large number of free electrons resulting from, for example, temperature rise or the photoelectric effect such as electromagnetic wave radiation. Aluminum thus increases the effect of the fluoride ion radicals capturing free electrons on the surface of aluminum, or forming electron pairs with the free electrons for chemical stabilization. Thus, the fluoride ion radicals are more likely to be localized on the second lower electrode layer 9b containing aluminum in the structure in the present disclosure.

The first upper electrode layer 13a and the second upper electrode layer 13b may be transparent conductive layers. The transparent conductive layers may be made of, for example, an ITO and an IZO (indium zinc oxide). This structure is suitable for external light incident on the first upper electrode layer 9a and the second upper electrode layer 9b.

The inactive area 51 may be located to surround the entire periphery of the active area 50. In this case, the dummy pixel units 40b in the inactive area 51 have no defect, and are thus effectively usable as inspection pixel units 40b. More specifically, all the pixel units 40 in the active area 50 and corresponding to the dummy pixel units 40b in the inactive area 51 can be inspected effectively. The dummy pixel units 40b in the inactive area 51 may be arranged in one or more rows in the peripheral direction. In multiple rows, the dummy pixel units 40b in the inactive area 51 can be inspected more effectively for defects. The multiple rows may be, for example, two or three rows.

The dummy pixel units 40b in the inactive area 51 may be arranged in one or two rows in the peripheral direction, and additional dummy pixel units 40b partially forming a row may be located outside the one or two rows. For example, the additional dummy pixel units 40b may be located in, for example, a portion of the input end for scanning signals for which more strict inspections are to be performed, or in a portion nearer a signal detection end.

On the substrate 1, the first lower electrode layer 9a and the second lower electrode layer 9b may be located in the same layer, the first lower extrinsic semiconductor layer 10a and the second lower extrinsic semiconductor layer 10b may be located in the same layer, the first intrinsic semiconductor layer 11a and the second intrinsic semiconductor layer 11b may be located in the same layer, the first upper extrinsic semiconductor layer 12a and the second upper extrinsic semiconductor layer 12b may be located in the same layer, and the first upper electrode layer 13a and the second upper electrode layer 13b may be located in the same layer. In this case, the first photodetector 30a and the second photodetector 30b can be manufactured with the same manufacturing process. Thus, a photodetection device without defects can be manufactured with a high yield with shorter manufacturing time. The pixel units 40 in the inactive area 51 can be easily fabricated to have the same structure as the pixel units 40 in the active area 50. Thus, the pixel units 40 in the inactive area 51 can be easily used as inspection pixel units for indirectly inspecting the pixel units 40 in the active area 50.

Figure 6:
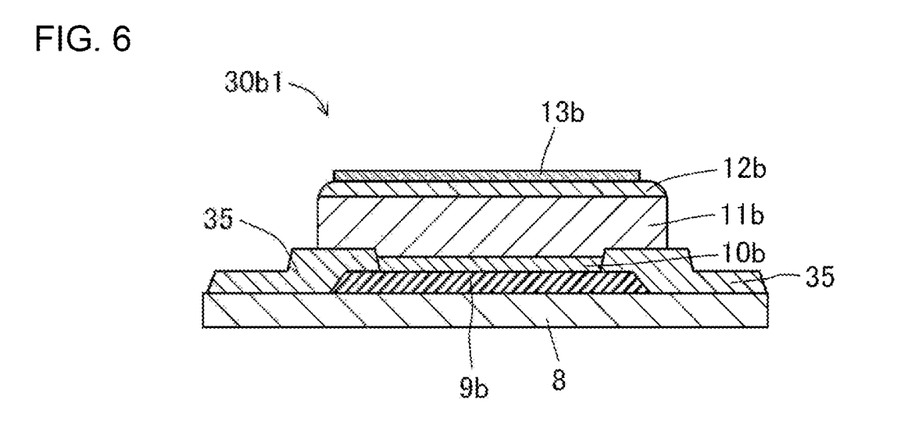
FIG. 6 is a cross-sectional view of a second photodetector included in a photodetection device according to another embodiment of the present disclosure.
Figure 7:
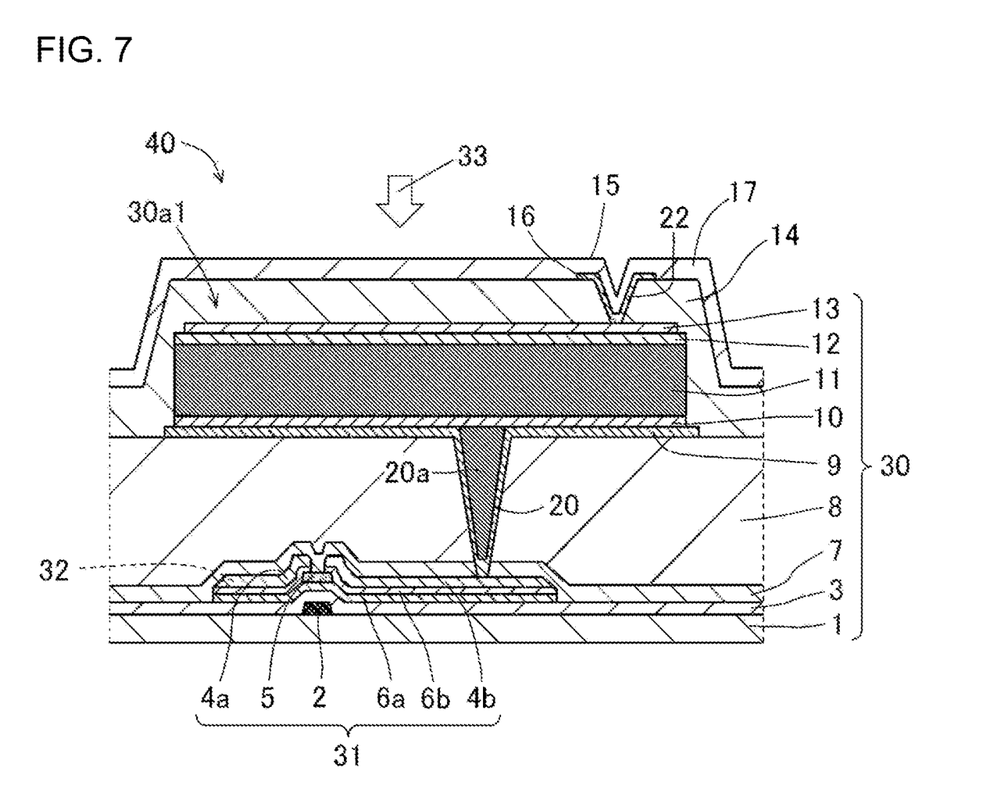
FIG. 7 is a cross-sectional view of a pixel unit in an active area including a first photodetector.

FIG. 6 is a cross-sectional view of a second photodetector 30b1 included in a photodetection device according to another embodiment of the present disclosure. FIG. 7 is a cross-sectional view of the pixel unit 40 in the active area 50 including a first photodetector 30a1. Portions corresponding to the portions in the above embodiment are denoted with the same reference signs without redundant description. Instead of the second photodetector 30b, the second photodetector 30b1 illustrated in FIG. 6 is located in the pixel unit 40 included in the inactive area 51 in the photodetection device according to the present embodiment during the manufacturing process. The first photodetector 30a1 is the same or similar to the first photodetector 30a in the above embodiment, and has the structure illustrated in FIG. 7.

More specifically, in addition to the components of the photodetection device according to the above embodiment, the photodetection device according to the present embodiment illustrated in FIG. 6 further includes a passivation layer 35 located between the outer periphery of the second lower electrode layer 9b and the outer periphery of the second lower extrinsic semiconductor layer 10b and protruding from the outer peripheries of the second upper extrinsic semiconductor layer 12b, the second intrinsic semiconductor layer 11b, and the second lower extrinsic semiconductor layer 10b over the insulating layer 8 on the substrate 1.

The passivation layer 35 is made of, for example, silicon oxide ($SiO_2$) or silicon nitride (SiNx), and covers at least part of the insulating layer 8 and the second lower electrode layer 9b to prevent any portion from remaining unetched during dry etching.

The photodetection device according to the present disclosure including the above embodiments is applicable to, for example, a radiological image forming device. The radiological image forming device includes a scintillator that performs wavelength conversion of radiation to output light, and the photodetection device according to the present disclosure. For example, the photodetection device includes a large number of pixel units 40 in a matrix of the row and column directions. The photodetection device with the above structure can obtain an accurate radiological image of a subject such as a human. The scintillator in the radiological image forming device according to the present disclosure is made of CsI:Tl, or GOS ($Gd_2O_2S$:Tb), and performs wavelength conversion of radiation, such as X rays, γ rays, or a rays applied to a subject, to output light. The scintillator is applied to a radiological image forming device using indirect conversion that obtains image information with the photodetection device according to the present disclosure photoelectrically converting light 33 emitted from the scintillator into an electric charge. The scintillator made of CsI:Tl is formed by vapor depositing a radiosensitive layer (scintillation layer) on a metal substrate of, for example, aluminum (Al). The scintillator is located at, for example, a position nearer the light source of the light 33 in the photodetection device according to the present disclosure, and is bonded to the light source with a bond such as an adhesive to form the radiological image forming device.

As described above, the photodetection device according to the present disclosure may include a scintillator that performs wavelength conversion of radiation to output light, at a position facing a surface of the substrate 1 on which the first photodetector 30a and the second photodetector 30b are located. The first photodetector 30a and the second photodetector 30b detect light output from the scintillator. In addition, the photodetection device according to the present disclosure may be a medical photodetection device, or an X-ray apparatus that uses X rays with a wavelength of 1 pm to 10 nm as radiation. In this case, the resultant X-ray apparatus can have fewer defects and can be manufactured with a high manufacturing yield.

Electric image information obtained with the radiological image forming device is further converted into digital data through AD (analog-to-digital) conversion, and converted into a digital image by an image processor. The digital image is displayed on display means such as an LCD (liquid crystal display) to be used for, for example, image diagnosis or image analysis.

The present disclosure may be implemented in the following forms.

In an embodiment of the present disclosure, a photodetection device includes a substrate, a plurality of pixel units on the substrate, a first photodetector included in a pixel unit of the plurality of pixel units, and a second photodetector included in a pixel unit of the plurality of pixel units. The plurality of pixel units is in a matrix of a row direction and a column direction. The pixel unit including the first photodetector is in an active area usable for photodetection on the substrate. The pixel unit including the second photodetector is in an inactive area unusable for photodetection. The inactive area surrounds the active area on the substrate. The first photodetector includes a first lower electrode layer on the substrate, a first lower extrinsic semiconductor layer containing a first extrinsic semiconductor and located on the first lower electrode layer and inside the first lower electrode layer in a plan view, a first intrinsic semiconductor layer on the first lower extrinsic semiconductor layer, a first upper extrinsic semiconductor layer containing a second extrinsic semiconductor and located on the first intrinsic semiconductor layer, and a first upper electrode layer on the first upper extrinsic semiconductor layer. The second photodetector includes a second lower electrode layer on the substrate, a second lower extrinsic semiconductor layer containing the first extrinsic semiconductor and located on the second lower electrode layer and covering the second lower electrode layer, a second intrinsic semiconductor layer on the second lower extrinsic semiconductor layer, a second upper extrinsic semiconductor layer containing the second extrinsic semiconductor and located on the second intrinsic semiconductor layer, and a second upper electrode layer on the second upper extrinsic semiconductor layer.

In the process of manufacturing the photodetection device according to the present disclosure, the second intrinsic semiconductor layer included in each pixel unit located in the inactive area is etched at a lower etching rate in dry etching. Thus, after the first intrinsic semiconductor layer and the first lower extrinsic semiconductor layer in each pixel unit in the active area that is etched at a higher etching rate are etched, the second lower electrode layer covered with the second lower extrinsic semiconductor layer is not etched intensively when the first lower electrode layer in the active area is etched intensively and the pixel unit in the inactive area is etched at a lower etching rate. Thus, each pixel unit located in the inactive area nearer the active area is not etched intensively, and each pixel unit located in the inactive area farther from the active area can avoid being etched insufficiently. In other words, all the pixel units in the inactive area are etched uniformly. Thus, the second lower extrinsic semiconductor layer and the second intrinsic semiconductor layer can avoid remaining unetched, and the yield in the process of manufacturing the photodetection device is less likely to decrease.

Although the embodiments of the present disclosure have been described in detail, the present disclosure is not limited to the above embodiments, and may be modified or changed variously without departing from the spirit and scope of the present disclosure. The components described in the above embodiments may be entirely or partially combined as appropriate unless any contradiction arises.

REFERENCE SIGNS 1 substrate
2 gate line
3 gate insulating layer
4a source electrode
4b drain electrode
5 etching stop layer
6a first semiconductor layer
6b second semiconductor layer
7 first passivation layer
8 insulating layer
9 lower electrode layer
9a first lower electrode layer
9b second lower electrode layer
10 lower extrinsic semiconductor layer
10a first lower extrinsic semiconductor layer
10b second lower extrinsic semiconductor layer
11 intrinsic semiconductor layer
11a first intrinsic semiconductor layer
11b second intrinsic semiconductor layer
12 upper extrinsic semiconductor layer
12a first upper extrinsic semiconductor layer
12b second upper extrinsic semiconductor layer
13 upper electrode layer
13a first upper electrode layer
13b second upper electrode layer
14 second passivation layer
15 third electrode layer
16 bias line
17 third passivation layer
20 lower contact hole
20a insulating filler
21 recess
22 upper contact hole
30 photodetector
30a first photodetector
30b, 30b1 second photodetector
31 TFT
32 source signal line
33 light
35 passivation layer
40 pixel unit
40b dummy pixel unit
48 gate signal line drive circuit
50 active area
51 inactive area

The invention claimed is:
1. A photodetection device, comprising:
a substrate;
a plurality of pixel units on the substrate, the plurality of pixel units being in a matrix of a row direction and a column direction;
a first photodetector included in a pixel unit of the plurality of pixel units, the pixel unit including the first photodetector being in an active area usable for photodetection on the substrate; and
a second photodetector included in a pixel unit of the plurality of pixel units, the pixel unit including the second photodetector being in an inactive area unusable for photodetection, the inactive area surrounding the active area on the substrate,
wherein the first photodetector includes
a first lower electrode layer on the substrate,
a first lower extrinsic semiconductor layer on the first lower electrode layer, the first lower extrinsic semiconductor layer being inside the first lower electrode layer in a plan view, the first lower extrinsic semiconductor layer comprising a first extrinsic semiconductor,
a first intrinsic semiconductor layer on the first lower extrinsic semiconductor layer, a first upper extrinsic semiconductor layer on the first intrinsic semiconductor layer, the first upper extrinsic semiconductor layer comprising a second extrinsic semiconductor, and a first upper electrode layer on the first upper extrinsic semiconductor layer, and the second photodetector includes a second lower electrode layer on the substrate, a second lower extrinsic semiconductor layer on the second lower electrode layer, the second lower extrinsic semiconductor layer covering the second lower electrode layer, the second lower extrinsic semiconductor layer comprising the first extrinsic semiconductor, a second intrinsic semiconductor layer on the second lower extrinsic semiconductor layer, a second upper extrinsic semiconductor layer on the second intrinsic semiconductor layer, the second upper extrinsic semiconductor layer comprising the second extrinsic semiconductor, and a second upper electrode layer on the second upper extrinsic semiconductor layer.

2. The photodetection device according to claim 1, wherein the second intrinsic semiconductor layer covers the second lower extrinsic semiconductor layer.

3. The photodetection device according to claim 1, wherein the first lower electrode layer includes an end face being a gentle slope forming an angle being acute with a surface of the substrate on which the plurality of pixel units is arrayed.

4. The photodetection device according to claim 3, wherein the end face of the first lower electrode layer forms the angle being less than or equal to 80°.

5. The photodetection device according to claim 1, wherein the first lower electrode layer comprises aluminum.

6. The photodetection device according to claim 1, wherein the second lower electrode layer includes an end face being a gentle slope forming an angle being acute with a surface of the substrate on which the plurality of pixel units is arrayed.

7. The photodetection device according to claim 6, wherein the end face of the second lower electrode layer forms the angle being less than or equal to 45°.

8. The photodetection device according to claim 1, wherein the second lower electrode layer comprises aluminum.

9. The photodetection device according to claim 1, wherein the first upper electrode layer and the second upper electrode layer are transparent conductive layers.

10. The photodetection device according to claim 1, further comprising:

a passivation layer between an outer periphery of the second lower electrode layer and an outer periphery of the second intrinsic semiconductor layer, the passivation layer protruding from the outer periphery of the second intrinsic semiconductor layer over the substrate.

11. The photodetection device according to claim 1, wherein the inactive area surrounds a full periphery of the active area.

12. The photodetection device according to claim 1, wherein on the substrate, the first lower electrode layer and the second lower electrode layer are located in a same layer, the first lower extrinsic semiconductor layer and the second lower extrinsic semiconductor layer are located in a same layer, the first intrinsic semiconductor layer and the second intrinsic semiconductor layer are located in a same layer, the first upper extrinsic semiconductor layer and the second upper extrinsic semiconductor layer are located in a same layer, and the first upper electrode layer and the second upper electrode layer are located in a same layer.

13. The photodetection device according to claim 1, further comprising:

a scintillator facing a surface of the substrate on which the first photodetector and the second photodetector are located, the scintillator being configured to perform wavelength conversion of radiation to output light, wherein the first photodetector and the second photodetector detect the light output from the scintillator.

14. The photodetection device according to claim 12, wherein the radiation includes an X ray with a wavelength of 1 pm to 10 nm.

15. The photodetection device according to claim 1, wherein the pixel unit in the inactive area is a pixel unit for indirectly inspecting the pixel unit in the active area.

16. The photodetection device according to claim 1, wherein the substrate is flexible.

* * * * *